United States Patent
Shams et al.

(10) Patent No.: US 11,600,903 B2
(45) Date of Patent: Mar. 7, 2023

(54) ASSEMBLY IN PLACE METHOD AND APPARATUS

(71) Applicant: Metawave Corporation, Carlsbad, CA (US)

(72) Inventors: Soren Shams, Carlsbad, CA (US); Ricky Donald Heckler, San Juan Capistrano, CA (US); Raul Inocencio Alidio, Carlsbad, CA (US); Taha Shahvirdi Dizaj Yekan, San Diego, CA (US)

(73) Assignee: METAWAVE Corporation, Carlsbad, CA (US)

(*) Notice: Subject to any disclaimer, the term of this patent is extended or adjusted under 35 U.S.C. 154(b) by 0 days.

(21) Appl. No.: 17/338,633

(22) Filed: Jun. 3, 2021

(65) Prior Publication Data

US 2021/0384610 A1    Dec. 9, 2021

Related U.S. Application Data

(60) Provisional application No. 63/039,332, filed on Jun. 15, 2020, provisional application No. 63/034,125, filed on Jun. 3, 2020.

(51) Int. Cl.
*H01Q 1/22* (2006.01)
*H01Q 23/00* (2006.01)
*G01S 7/03* (2006.01)
*H01L 23/66* (2006.01)

(52) U.S. Cl.
CPC ........... *H01Q 1/2283* (2013.01); *G01S 7/032* (2013.01); *H01L 23/66* (2013.01); *H01Q 23/00* (2013.01); *H01L 2223/6677* (2013.01)

(58) Field of Classification Search
CPC .................................................. H01Q 1/2283
USPC .................................................. 343/700 MS
See application file for complete search history.

(56) References Cited

U.S. PATENT DOCUMENTS

| | | | |
|---|---|---|---|
| 8,149,177 B1* | 4/2012 | Callus | H01Q 21/005 343/705 |
| 2012/0327686 A1* | 12/2012 | Chen | G02F 1/133308 362/611 |

* cited by examiner

*Primary Examiner* — Peguy Jean Pierre
(74) *Attorney, Agent, or Firm* — Sandra Lynn Godsey

(57) ABSTRACT

In the present invention a guide or carrier is used to assemble and position multiple AiPs (or Integrated Circuit packages) on a substrate and maintain spacing therebetween. In some examples, this reduces package size and maintains desired tolerances. The carrier or guard is to be thin and flexible so as to allow some movement but maintain tolerances at specific locations.

10 Claims, 5 Drawing Sheets

ASSEMBLY IN PLACE METHOD AND APPARATUS

CLAIM OF PRIORITY

This application claims priority from U.S. Provisional Application No. 63/034,125, titled "Assembly In Place Method and Apparatus," filed on Jun. 3, 2021, and incorporated herein by reference in its entirety; and U.S. Provisional Application No. 63/039,332, titled "Assembly In Place Method And Apparatus," filed on Jun. 15, 2020, and incorporated herein by reference in its entirety.

BACKGROUND

Various technologies assemble portions and components at different stages and in different places. These techniques include various complicated ways to build integrated circuits, antenna in package and other circuits and structures.

BRIEF DESCRIPTION OF THE DRAWINGS

The present application may be more fully appreciated in connection with the following detailed description taken in conjunction with the accompanying drawings, which are not drawn to scale, in which like reference characters refer to like parts throughout, and in which.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology. In other instances, well-known methods and structures may not be described in detail to avoid unnecessarily obscuring the description of the examples. Also, the examples may be used in combination with each other.

Figure 5:
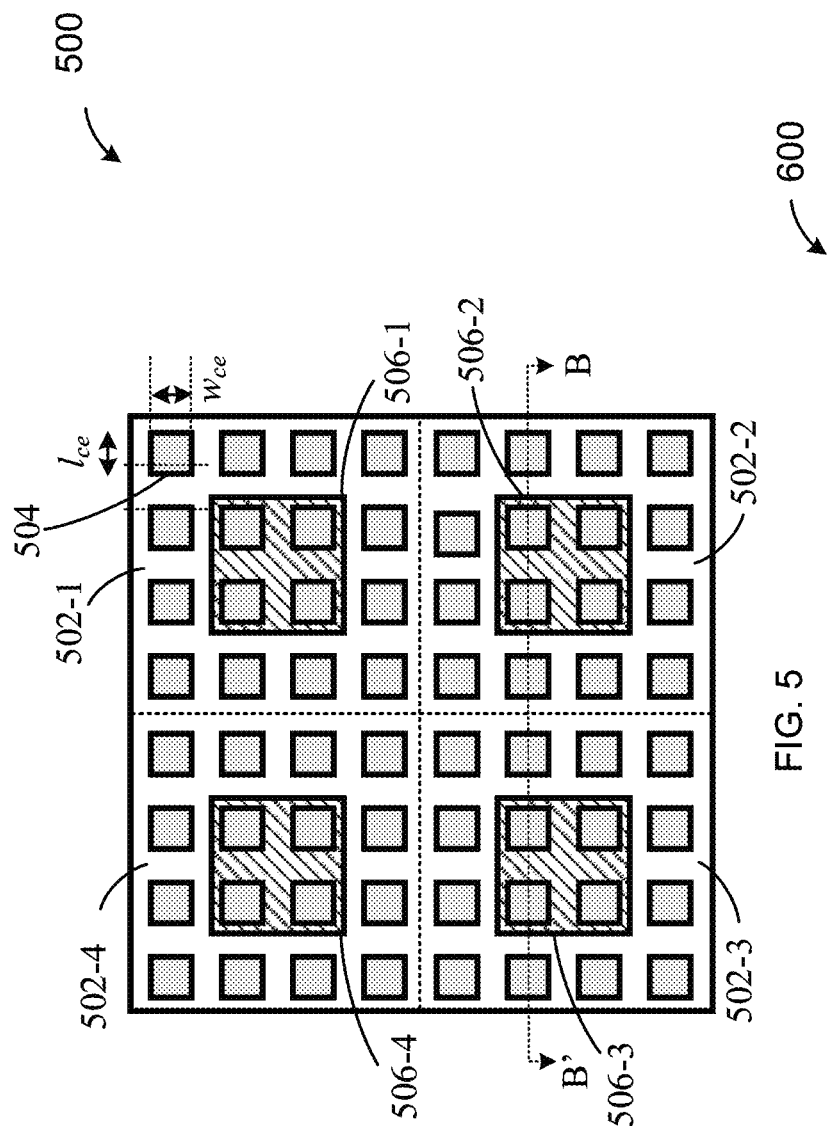
FIG. 5 illustrates a schematic diagram of a two-dimensional (2D) radar phased array system with beamformer integrated circuit package tiles assembled in accordance with one or more implementations of the subject technology.

The present invention provides apparatus and method to achieve desired tolerances in an AiP (Antenna in Package) based device. During assembly of multiple AiPs on a single substrate the position of the AiPs may move during placement. The present invention uses a carrier or guide to place the AiPs and then later remove the guide. Multiple AiPs positioned on a substrate may form a tile, such as illustrated in FIG. 5. The individual AiPs are diced from a package sheet prior to placement. In some examples, solder balls are melted to attach the AiPs to the substrate, during which process the individual AiPs may move. By use of a guide or carrier, the AiPs stay in the proper position and maintain spacing therebetween. This is particularly helpful when reducing package size and maintaining required tolerances. The carrier or guard is to be thin and flexible so as to allow some movement but maintain tolerances at specific locations.

Figure 1:
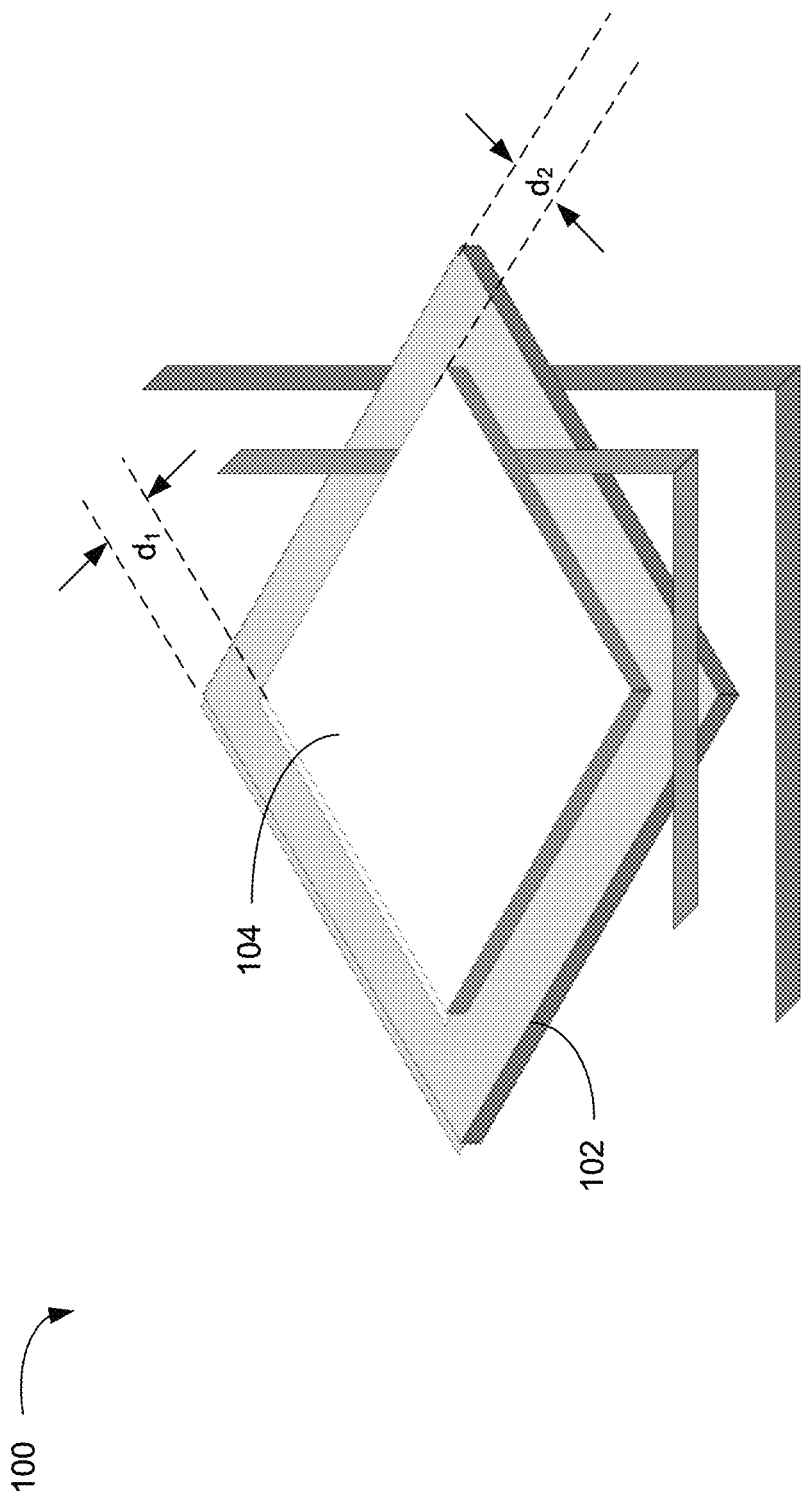
FIG. 1 illustrates an example of an integrated circuit package positioned on a substrate, in accordance with prior art assembly techniques.

The present invention relates to methods for assembly of integrated circuits (ICs) packages, fabricated in different processes such as FCBGA and FCCSP. FIG. 1 illustrates an assembly 100 having a substrate 102 with a AiP 104 positioned thereon. The position is defined by spacing $d_1$ on one side and spacing $d_2$ on another side.

Figure 2:
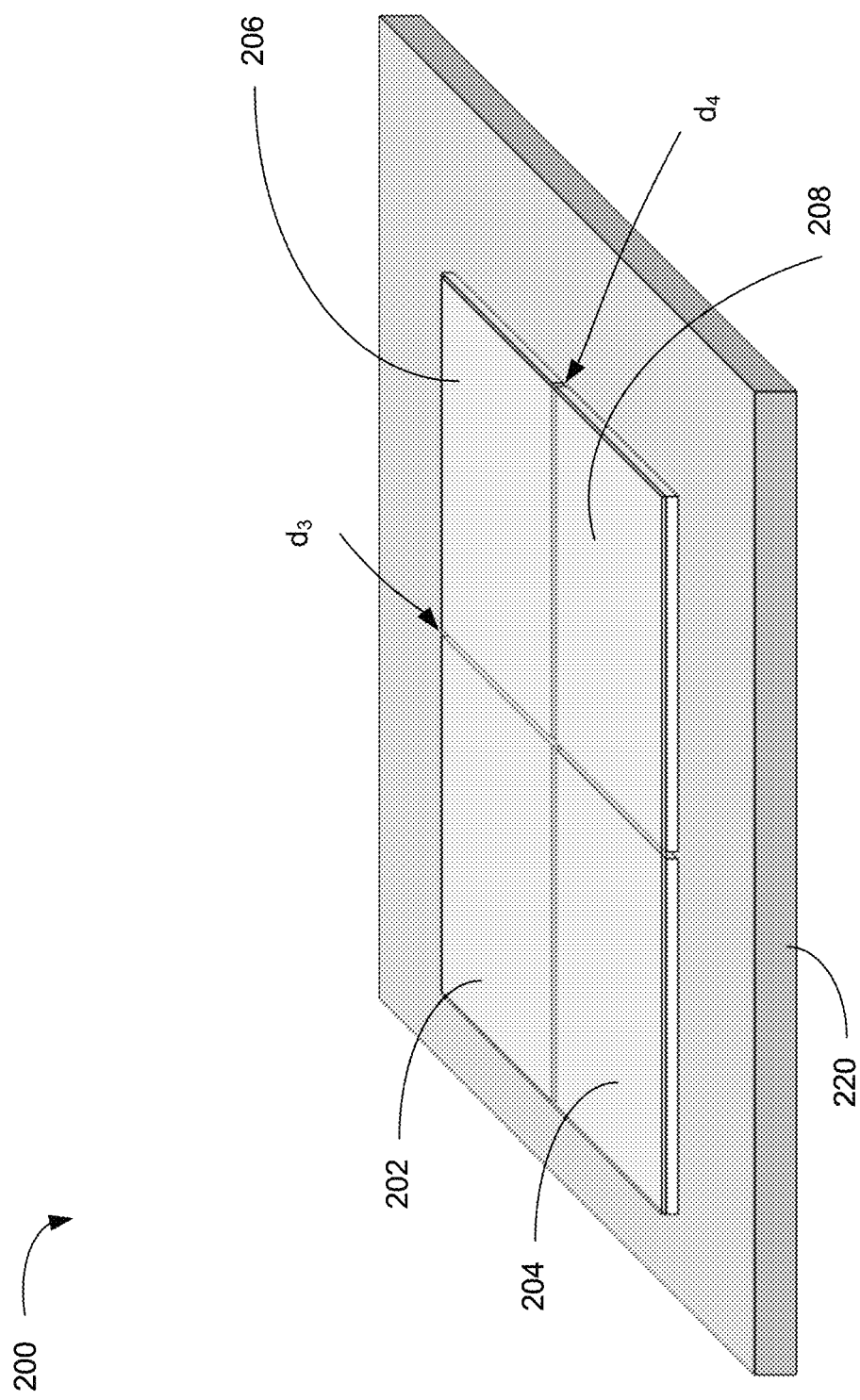
FIG. 2 illustrates an example of an integrated circuit package assembly in accordance with one or more implementations of the subject technology.
Figure 3:
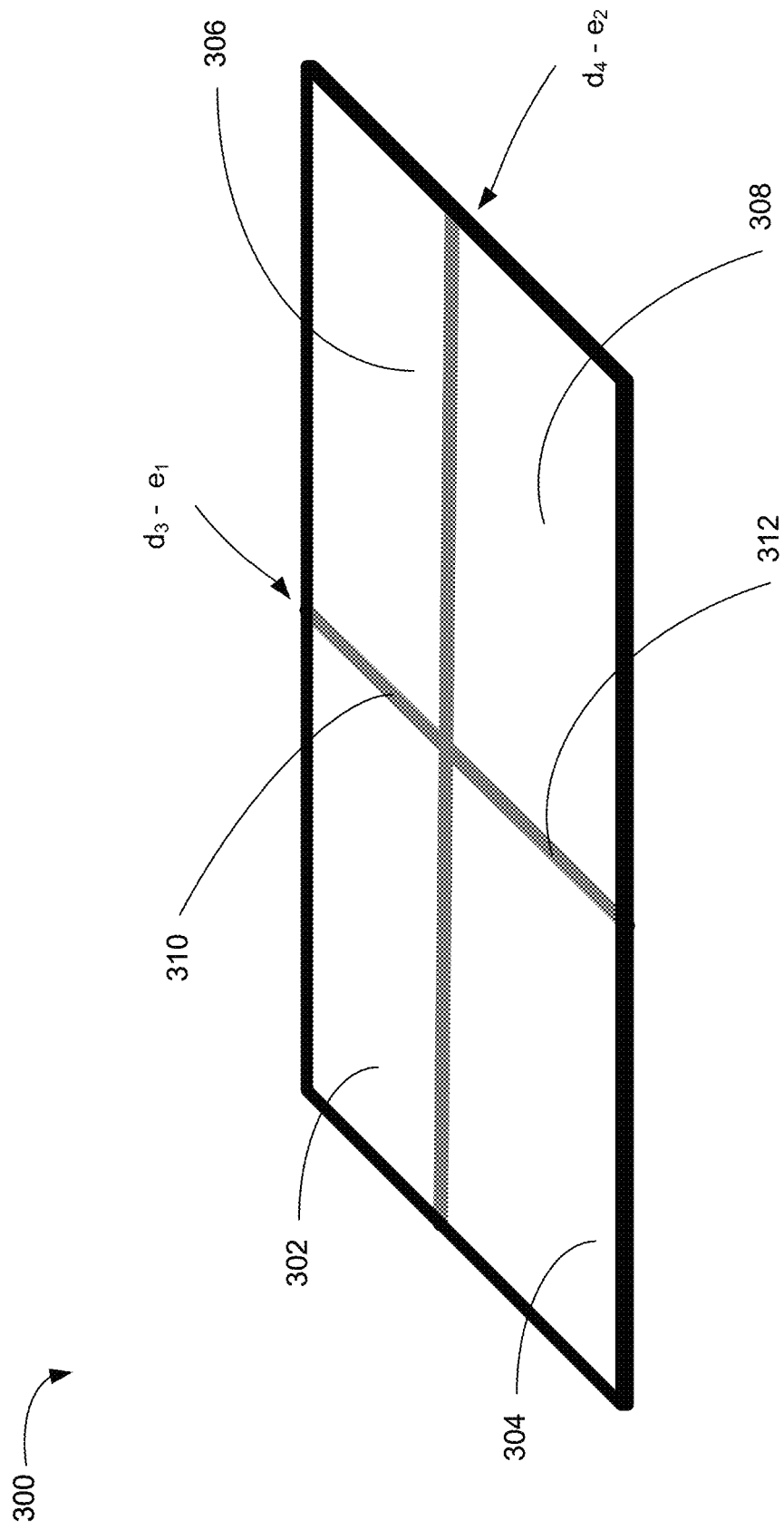
FIG. 3 illustrates a guide for an integrated circuit package assembly in accordance with various implementations of the subject technology.

FIG. 2 illustrates an assembly 200 having multiple AiPs positioned on substrate 220. The AiPs 202, 204, 206, 208 are spaced with respect to each other by spacings $d_3$ and $d_4$. The AiPs are assembled in place to maintain such spacing using a guide 300 of FIG. 3. The guide 300 includes a frame portion with open areas 302, 304, 306, 308. The frame portion intersecting pieces 310, 312 having dimensions $(d_3-e_1)$ and $(d_4-e_1)$, respectively. These dimensions may be equal or may be different sizes but are designed to ensure the spacing between AiPs during assembly. The guide 300 is made of a material that may be removed after assembly. It may be a sacrificial material that dissolves or otherwise does not retain after assembly.

Figure 4:
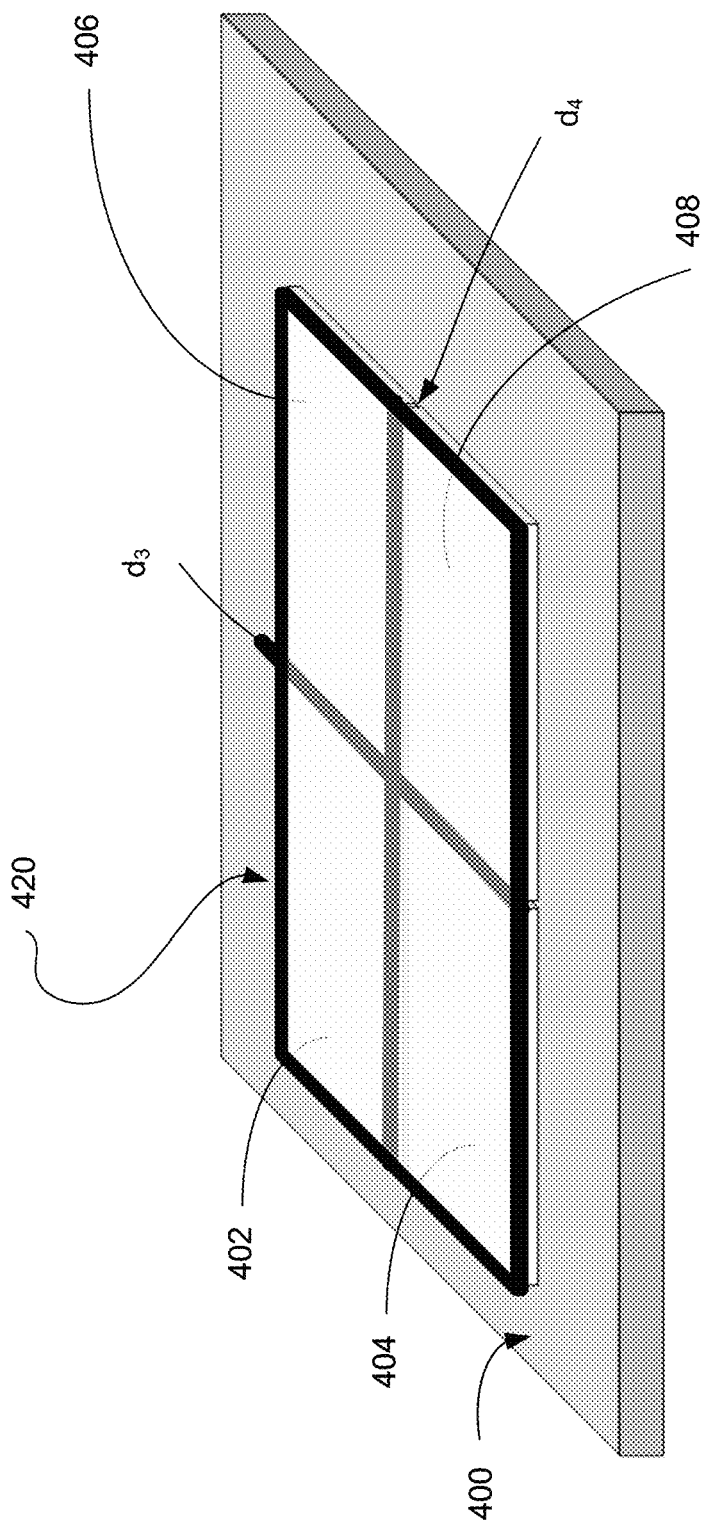
FIG. 4 illustrates a guide positioned on an integrated circuit package in accordance with one or more implementations of the subject technology.

FIG. 4 illustrates a guide 420 applied over substrate 400 and positioned for assembly of multiple AiPs 402, 404, 406, 408, which are then placed according to the guide 420. After placement of AiPs 402, 404, 406, 408, the guide 420 is removed resulting in proper spacing between the AiPs. The assembly process may include multiple layers of the substrate, where the AiPs and other components are built thereon. Connectivity may be achieved by ball connections on an opposite side. The shape of the specific guide structure is variable and may be flexible to enable multiple uses from a given guide structure.

AiP 500 having a single IC chip assembled using a guide as described herein is illustrated in FIG. 5. The various radiating elements 502, 506, 504 are positioned on the substrate. As illustrated, there are a variety of configurations, combinations and dimensions to achieve the tolerances and proper operation of the structure 500. AiP devices are antennas and therefore the interaction with antenna elements, as well as the currents flowing through the entire structure, are critically defined. To achieve the desired operation, the placement of the various AiPs and other components must be placed in specific locations. At high frequency, such as required in autonomous driving or 5G cellular and other applications, this spacing and the dimensions become critical, while the goal is to reduce the size of the overall device.

In the AiP, the antenna is integrated into a package along with the RFIC so they are directly integrated into the package along with other ICs. Traditionally, an antenna is placed on a board, separate from the RFIC chipset. This approach is known as a discrete antenna approach. The AiP solution in a wireless system is an improvement to the discrete antenna approach, as the RFIC and the antenna are integrated into a single package which is easier to manage, less prone to interference, more stable and easier to manufacture. Other components and ICs may be built on the substrate providing a compact design.

Figure 6:
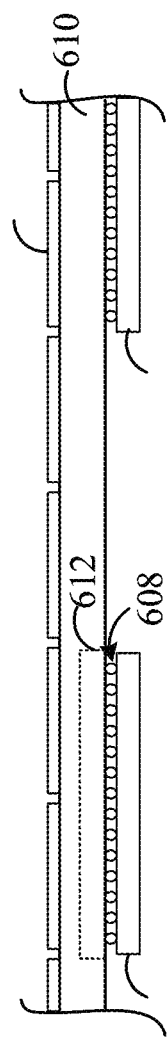
FIG. 6 illustrates an IC package assembled in accordance with one or more implementations of the subject technology.

FIG. 6 illustrates a side view of a structure built on a substrate. The device includes several layers, with AiPs and/or other components built on the top. A guide is used to assemble and ensure spacing in multiple directions, such as height, width, depth of each of the components and/or AiPs. The structure minimizes the size of the device in multiple ways.

It is appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Furthermore, to the extent that the term "include," "have," or the like is used in the description or the claims, such term is intended to be inclusive in a manner similar to the term "comprise" as "comprise" is interpreted when employed as a transitional word in a claim.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

While this specification contains many specifics, these should not be construed as limitations on the scope of what may be claimed, but rather as descriptions of particular implementations of the subject matter. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. Moreover, the separation of various system components in the aspects described above should not be understood as requiring such separation in all aspects, and it should be understood that the described program components and systems can generally be integrated together in a single hardware product or packaged into multiple hardware products. Other variations are within the scope of the following claim.

What is claimed is:

1. A device assembly structure, comprising:

a substrate structure;

an integrated circuit (IC) configured on the substrate structure, the IC comprising:

a first portion having a first dimension, the first dimension contributing a tolerance of the device, and a second dimension contributing to the tolerance of the device; and a guide structure for generating the first and second dimensions of the first portion, wherein the first dimension is a first spacing of the IC on the substrate structure and the second dimension is a second spacing of the IC on the substrate structure.

2. The device assembly structure as in claim 1, further comprising:

a plurality of ICs configured on the substrate structure proximate the IC, wherein the guide structure is positioned to maintain the first and second dimensions around each of the plurality of ICs.

3. The device assembly structure as in claim 2, wherein the guide structure is removable.

4. The device assembly structure as in claim 3, wherein the device assembly is an antenna in package (AiP).

5. The device assembly structure as in claim 4, further comprising:

a beamsteering circuit coupled to the AiP.

6. The device assembly structure as in claim 5, wherein the beamsteering circuit is an analog device, comprising amplifiers.

7. The device assembly structure as in claim 6, wherein multiple AiPs are positioned on the substrate structure to form a tile.

8. The device assembly structure as in claim 7, wherein the guard structure reduces package size and maintains spacing between the multiple AiPs.

9. A method for assembling an Antenna in Package (AiP), comprising:
   positioning a guide on a substrate, the guide having one or more dimensions corresponding to one or more spacings between AiPs, the dimensions creating a tolerance for the AiP; and
   placing the AiPs according to the guide.

10. The method as in claim 9, wherein the AiP is part of a radar system.

* * * * *